(12) United States Patent
Ho

(10) Patent No.: US 8,738,335 B1
(45) Date of Patent: *May 27, 2014

(54) SOLVING A CIRCUIT NETWORK IN HIERARCHICAL, MULTICORE, AND DISTRIBUTED COMPUTING ENVIRONMENT

(75) Inventor: William Wai Yan Ho, San Jose, CA (US)

(73) Assignee: WorldWide Pro Ltd., Hong Kong (CN)

( * ) Notice: Subject to any disclaimer, the term of this patent is extended or adjusted under 35 U.S.C. 154(b) by 270 days.

This patent is subject to a terminal disclaimer.

(21) Appl. No.: 13/159,384

(22) Filed: Jun. 13, 2011

Related U.S. Application Data

(63) Continuation-in-part of application No. 12/915,362, filed on Oct. 29, 2010, now Pat. No. 8,396,696, which is a continuation of application No. 11/421,206, filed on May 31, 2006, now Pat. No. 7,827,016, and a continuation-in-part of application No. 11/421,212, filed on May 31, 2006, now Pat. No. 8,112,264.

(60) Provisional application No. 61/354,186, filed on Jun. 11, 2010, provisional application No. 61/354,189, filed on Jun. 11, 2010.

(51) Int. Cl.
*G06F 17/50* (2006.01)

(52) U.S. Cl.
USPC .................................. 703/2; 703/14; 703/24

(58) Field of Classification Search
USPC ................................................ 703/2, 14, 24
See application file for complete search history.

(56) References Cited

U.S. PATENT DOCUMENTS

| | | | |
|---|---|---|---|
| 4,775,950 A | 10/1988 | Terada et al. | |
| 5,379,231 A | 1/1995 | Pillage et al. | |
| 5,446,676 A | 8/1995 | Huang et al. | |
| 6,807,520 B1 | 10/2004 | Zhou et al. | |
| 7,353,157 B2 | 4/2008 | Wasynczuk et al. | |
| 7,630,370 B2 * | 12/2009 | Deshpande et al. | 370/390 |
| 7,827,016 B1 * | 11/2010 | Ho | 703/13 |
| 8,112,264 B1 * | 2/2012 | Ho | 703/14 |
| 2004/0215430 A1 * | 10/2004 | Huddleston et al. | 703/2 |
| 2007/0171733 A1 | 7/2007 | Wood | |
| 2007/0198971 A1 * | 8/2007 | Dasu et al. | 717/140 |
| 2008/0072190 A1 | 3/2008 | Jain et al. | |
| 2008/0205394 A1 * | 8/2008 | Deshpande et al. | 370/390 |

OTHER PUBLICATIONS

Klinger, V., "DiPaCS: A New Concept for Parallel Circuit Simulation", Simulation Symposium, 1995, Proceedings of the 28th Annual, Apr. 9-13, 1995, pp. 32-41.

\* cited by examiner

*Primary Examiner* — Thai Phan
(74) *Attorney, Agent, or Firm* — Aka Chan LLP

(57) ABSTRACT

Any primitive cells or blocks can be represented physically by a Barycenter compact model, and any black box model can also be physically represented by a Barycenter compact model physically. A hierarchical boundary condition between blocks is formulated by the Barycenter model or Barycenter compact model. Hierarchical boundary condition problems between blocks can be limited within two levels only if using the Barycenter model or Barycenter compact model.

20 Claims, 15 Drawing Sheets

Graph

SOLVING A CIRCUIT NETWORK IN HIERARCHICAL, MULTICORE, AND DISTRIBUTED COMPUTING ENVIRONMENT

CROSS-REFERENCE TO RELATED APPLICATIONS

This application claims the benefit of U.S. provisional patent applications 61/354,186 and 61/354,189, both filed Jun. 11, 2010, and is a continuation-in-part of U.S. patent application Ser. No. 12/915,362, filed Oct. 29, 2010, which is a continuation of U.S. patent application Ser. No. 11/421,206, filed May 31, 2006, issued as U.S. Pat. No. 7,827,016 on Nov. 2, 2010, and Ser. No. 11/421,212, filed May 31, 2006, which are incorporated by reference along with all other cited references in this application.

BACKGROUND OF THE INVENTION

This present invention relates to the field of electronic design automation for electronic circuits, and more specifically, to systems and techniques to solve a network using a Barycenter model and a hierarchical scheduler.

The age of information and electronic commerce has been made possible by the development of electronic circuits and their miniaturization through integrated circuit technology. Integrated circuits are sometimes referred to as "chips." Some types of integrated circuits include digital signal processors (DSPs), amplifiers, dynamic random access memories (DRAMs), static random access memories (SRAMs), erasable programmable read only memories (EPROMs), electrically erasable programmable read only memories (EEPROMs), Flash memories, microprocessors, application specific integrated circuits (ASICs), and programmable logic.

Integrated circuits have been widely adopted and are used in many products in the areas of computers and other programmed machines, consumer electronics, telecommunications and networking equipment, wireless network and communications, industrial automation, and medical instruments, just to name a few. Electronic circuits and integrated circuits are the foundation of the Internet and other on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and greater complexity, and better performance in integrated circuits.

Large modern day integrated circuits have millions of devices including gates and transistors and are very complex. As process technology improves, more and more devices may be fabricated on a single integrated circuit, so integrated circuits will continue to become even more complex with time. In the past, many parasitic effects may not have been considered because they were less significant or insignificant compared to other factors.

As lithography and miniaturization techniques advance, on-chip devices and line widths become smaller, frequencies increase. As a consequence, many more impedances such as parasitic resistances, inductances, and capacitances and parasitic effects need to be considered. If these parasitics and effects are not taken into account, poor simulation results will result, and possible the electronic circuits will not work as expected after the circuit is fabricated. As more and more parasitic and other effects are accounted for, the circuit networks to be simulated become much more complex. As complexity increases, simulating the network takes significantly more computing resources and computation time.

More specifically, in nanometer, gigahertz, low power VLSI design, power, and signal integrity has become critical. To accurately analyze chip performance, it is desirable to consider the impact of power fluctuation, and the capacitive, inductive, or even substrate coupling noise with devices, or any combination of these. This analysis entails considering a very large amount of elements, which results in a very large system matrix for circuit simulation. This is a lack of a circuit simulation algorithm that can simultaneously resolve a large number of linear or linear with nonlinear devices while maintaining both efficiently and accuracy.

Some problems with the prior art are performance, capacity (millions of elements), accuracy (iterative matrix solver may be divergent for large network and hard for parallel processing and distributed computing), the size of memory has limitation in the computer, multi-thread is limited by memory size, distributed computing (does not share memory), diakoptics (tearing and reassembly, but no reassembly method for hierarchical design), and no efficient way to formulate the hierarchical boundary condition and solve the problem.

Therefore, there is a need for tools for solving networks.

BRIEF SUMMARY OF THE INVENTION

A technique uses a Barycenter model and hierarchical scheduler to solve a large network in a computing environment. The computing environment can be homogeneous or heterogeneous such as multiple cores, grid, and networking together. A tool of the invention solves a circuit network in a hierarchical, multicore, and distributed computing environment and obtains an exact solution.

In an implementation, memory usage is controlled by I/O slicing to fit a limitation of the computer memory system. In another implementation, primitive cells or blocks are represented physically by a Barycenter compact model. A black box model can also be physically represented by a Barycenter compact model physically.

In an implementation, a hierarchical boundary condition between blocks is formulated by the Barycenter model or Barycenter compact model. Hierarchical boundary condition problems between blocks can be limited within two levels if using the Barycenter model or Barycenter compact model.

A method is provided for solving a boundary condition of a large network by a direct method. A method is provided for solving a boundary condition of a large network by an iterative method. A method is provided for solving a boundary condition of a large network by both a direct and an iterative method.

In an implementation, a hierarchical scheduler is generated by a hierarchical netlist partition or user defined. In another implementation, job dependence and job submittal in a multicore or distributed computing environment is managed by a hierarchical scheduler.

Some Concepts include primitive cell; block; branch, meaning impedance or admittance, such as R (resistance), C (capacitance), L (inductance) or Mutual Impedance such as M, or K; I/O branch current; I/O branch voltage; internal branch current; internal branch voltage; nodal voltage; mesh current; mesh voltage; ideal current source; ideal voltage source; full pins equivalent model; I/O equivalent model; black box model; Barycenter model, a Barycenter is the center of mass of two or more bodies which are orbiting each other, and is the point around which both of them orbit; Barycenter compact model; multiple cores, Networking and Grid Computers; and hierarchical database.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
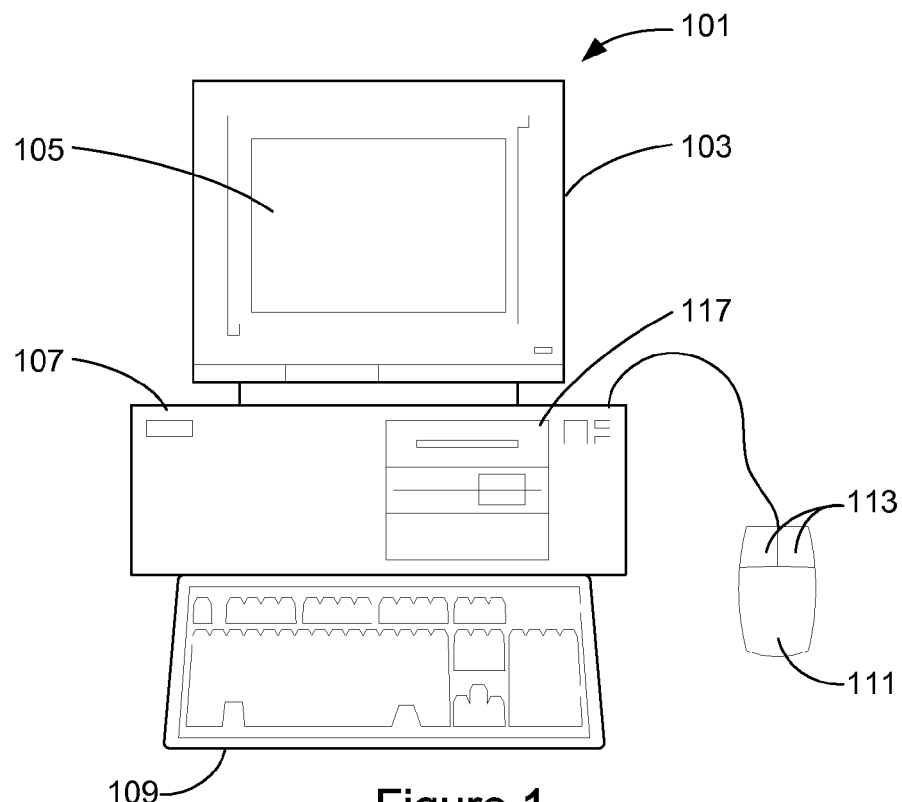
FIG. 1 shows a system of the present invention for using a Barycenter model and hierarchical scheduler to solve a large network in hierarchical, multicore, and a distributed computing environment.

FIG. 1 shows a system of the present invention for using a Barycenter model and hierarchical scheduler to solve a large network in hierarchical, multicore, and a distributed computing environment. In an embodiment, the invention is software that executes on a computer workstation system, such as shown in FIG. 1. FIG. 1 shows a computer system 101 that includes a monitor 103, screen 105, cabinet 107, keyboard 109, and mouse 111. In some implementations, however, the modeling and simulating systems are operated headless, which means these systems will not a mouse, keyboard, display, and so forth. Mouse 111 may have one or more buttons such as mouse buttons 113. Cabinet 107 houses familiar computer components, some of which are not shown, such as a processor, memory, mass storage devices 117, and the like.

Mass storage devices 117 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other non-volatile solid-state storage (e.g., USB flash drive), battery-backed-up volatile memory, tape storage, reader, and other similar media, and combinations of these. A binary machine-executable version of the software of the present invention may be stored or reside on mass storage devices 117. Furthermore, the source code of the software of the present invention may also be stored or reside on mass storage devices 117 (e.g., magnetic disk, tape, CD-ROM, or DVD).

A computer-implemented version of the invention may be embodied using, or reside on, computer readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications. Storage and computing may be via the Internet such as on the cloud or cloud computing.

For example, a binary, machine-executable version, of the software of the present invention may be stored or reside in RAM or cache memory, or on mass storage device 117. The source code of the software of the present invention may also be stored or reside on mass storage device 117 (e.g., hard disk, magnetic disk, tape, or CD-ROM). As a further example, code of the invention may be transmitted via wires, radio waves, or through a network such as the Internet.

Figure 2:
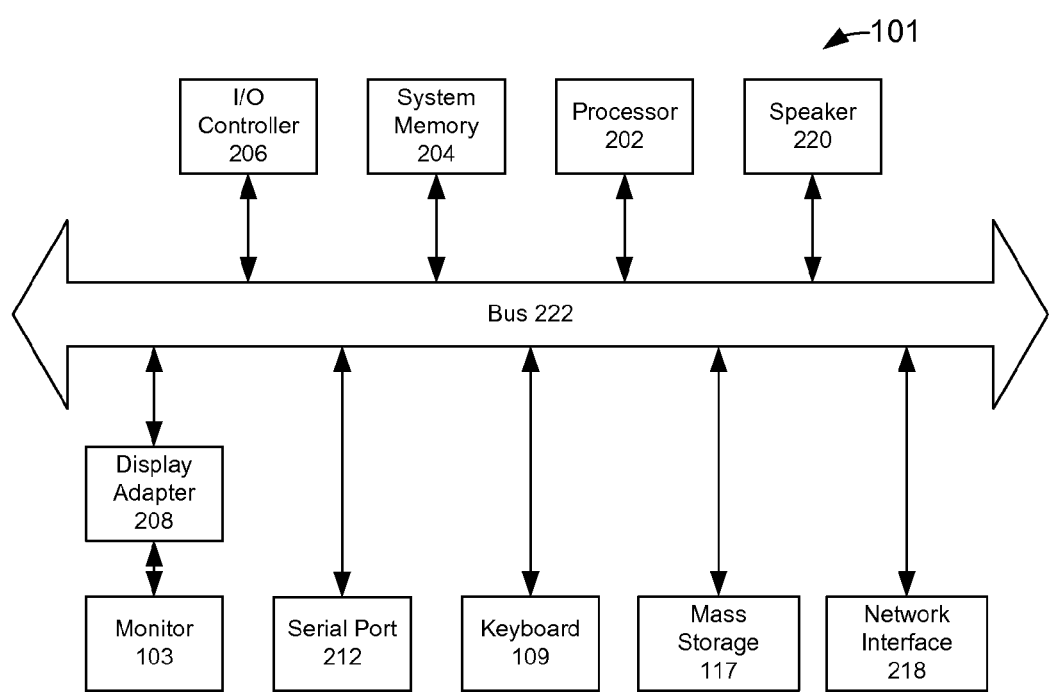
FIG. 2 shows a system block diagram of computer system 101 used to execute software of the present invention.

FIG. 2 shows a system block diagram of computer system 101 used to execute software of the present invention. As in FIG. 1, computer system 101 includes monitor 103, keyboard 109, and mass storage devices 117. Computer system 101 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal Ethernet network, Internet, or other network. Some examples of distributed computer systems for solving problems over the Internet include Folding@home, SETI@home, and the Great Internet Mersenne Prime Search (GIMPS).

Arrows such as 222 represent the system bus architecture of computer system 101. However, these arrows are illustrative of any interconnection scheme serving to link the subsystems. For example, speaker 220 could be connected to the other subsystems through a port or have an internal connection to central processor 202. Computer system 101 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, MatLab (from MathWorks, Inc.), SAS, SPSS, Java, JavaScript, and AJAX. The computer software product may be an independent application with data input and data display modules. Alternatively, the computer software products may be classes that may be instantiated as distributed objects. The computer software products may also be component software such as Java Beans (from Oracle) or Enterprise Java Beans (EJB from Oracle).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows 8, Windows CE, Windows Mobile), Linux, HP-UX, UNIX, Sun OS, Solaris, Mac OS X, Apple iOS, Android, Alpha OS, AIX, IRIX32, or IRIX64, or combinations of these. Other operating systems may be used. Each computer in a distributed computing environment may use a different operating system.

Furthermore, the computer may be connected to a network and may interface to other computers using this network. For example, each computer in the network may perform part of the task of the many series of circuit simulation steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

A specific type of electronic design automation tool is a circuit simulation program or system. A circuit simulation program performs analysis of circuits containing resistors, capacitors, inductors, mutual inductors, independent voltage and current sources, dependent sources, transmission lines, and semiconductor devices including diodes, bipolar junction transistors (BJTs), junction field effect transistors (JFETs), and metal over semiconductor field effect transistors (MOSFETs). A circuit simulator may perform nonlinear DC, nonlinear transient, linear AC, and other analyses.

One circuit simulation program is SPICE, originating from the University of California, Berkeley. SPICE stands for "Simulation Program Integrated Circuits Especially!" Despite the success of SPICE and other circuit simulation programs, existing circuit simulation programs use methodology and computational techniques not suitable for use in distributed computing environment and determining real or exact solutions.

Figure 3:
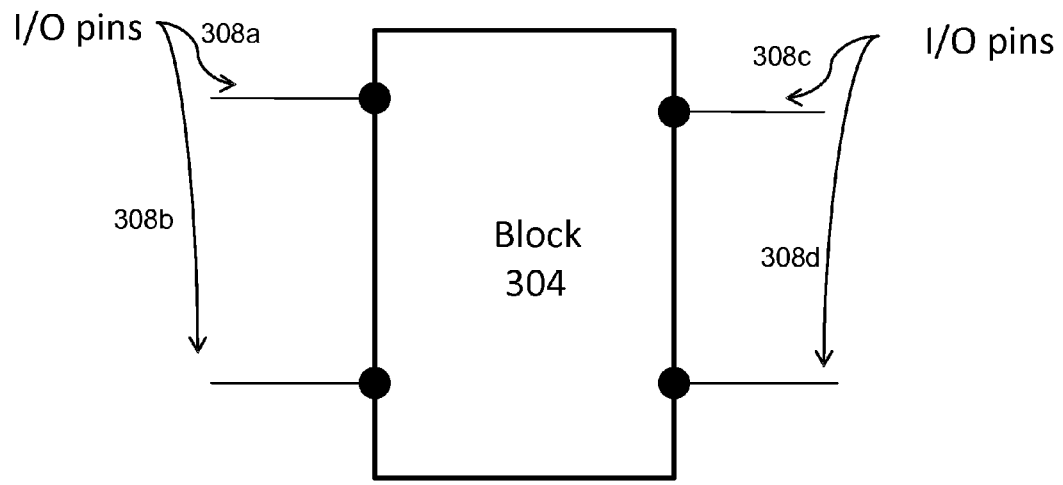
FIG. 3 shows a black box model.

FIG. 3 shows a black box model 304. In the figure, a block 304 has four I/O (input/output) pins 308a-308d. The input-out pins of block 304 are the points through which the block connects externally to other blocks (nodes and branches).

Figure 4:
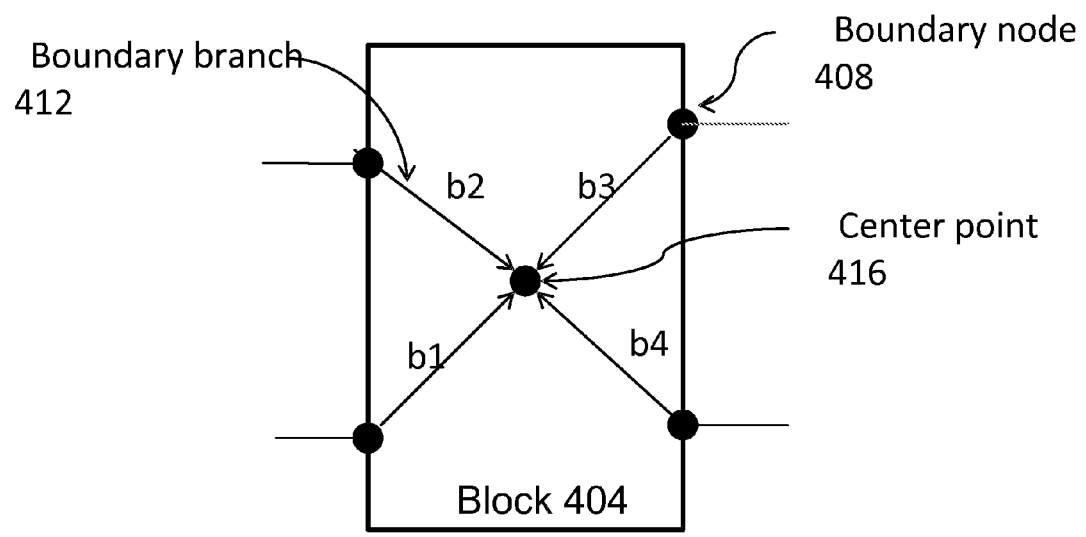
FIG. 4 shows a Barycenter model block.

FIG. 4 shows a Barycenter model block 404. The Barycenter model block has a boundary node 408, a boundary branch 412, and a center point 416. The center point can be one of the boundary points or internal node. The Barycenter is a coupling model between all boundary branches. The boundary branch direction may be used +1 to represent current injection from boundary node to the center point; −1 to represent current exit from center point to boundary point. The Barycenter model may be a complete coupling modeling between all boundary nodes and boundary branches.

In this model block, there are a number of four boundary nodes 408. There are a four boundary branches (412) b1, b2, b3, and b4. Each of the four boundary nodes is connected to one branch b1, b2, b3, or b4. There is a center point node 416 connected to branches b1, b2, b3, and b4. Note that each the center point node is connected to each of the boundary nodes through, at most, a single boundary branch.

In comparison to other models for a circuit block, all the boundary nodes connect through a single branch to a center point node. There are no boundary nodes that do not connect to other boundary nodes directly or connect to other nodes within the block. There are no other nodes within the block other than the center point node. A boundary node does not connect passing through another node before connecting to the center point node; the boundary node directly connects to the center point node through a branch (e.g., b1, b2, b3, or b4).

Although referred to as the center point node, this node is not at a physical center of the block. Center point is a reference that it is a point between each of the boundary nodes. The point is not necessarily centered or in a center from a geometric point of view.

Figure 5:
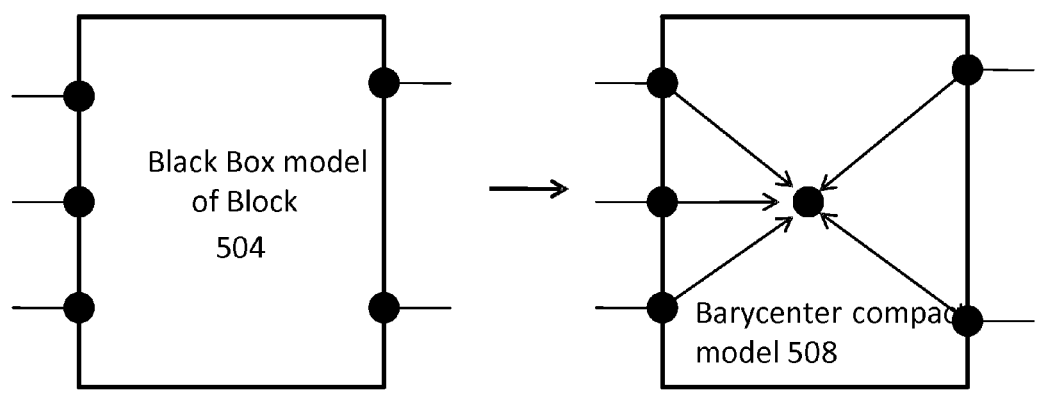
FIG. 5 shows a black box model being replaced with a Barycenter compact model.

FIG. 5 shows a black box model 504 being replaced or substituted with a Barycenter compact model 508. As was discussed above, model 508 has boundary nodes, each of which is connected through a single boundary branch to a single center point node.

Figure 6:
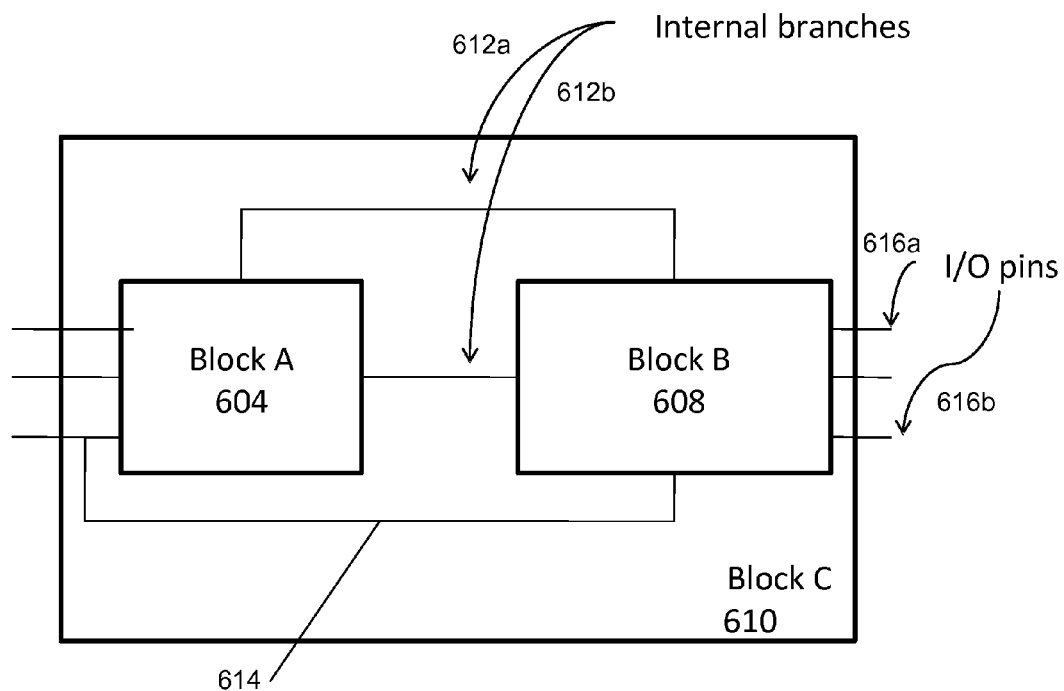
FIG. 6 shows an implementation of interconnected blocks within a block.

FIG. 6 shows an implementation of interconnected blocks within a block. More specifically, a block A 604 is interconnected to a block B 608 within a block C 610. Internal branches 612a and 612b connect blocks A and B. A value calculated in block A can be transmitted to block B via internal branch 612a. Further, an output of block A can be received as input to block B via internal branch 612b. There is also a feedback path 614 from block B back to an I/O pin of block A. Block B has I/O pins 616a and 616b.

Block B is shown as having three I/O pins. However, a block can have any number of I/O pins. In other implementations, block B has one, two, five, or seven I/O pins. Further, in this specific implementation, two blocks are interconnected. However, there can be more than two interconnected blocks. For example, in another specific implementation, three, four, five, ten, or more blocks may be interconnected.

Figure 7:
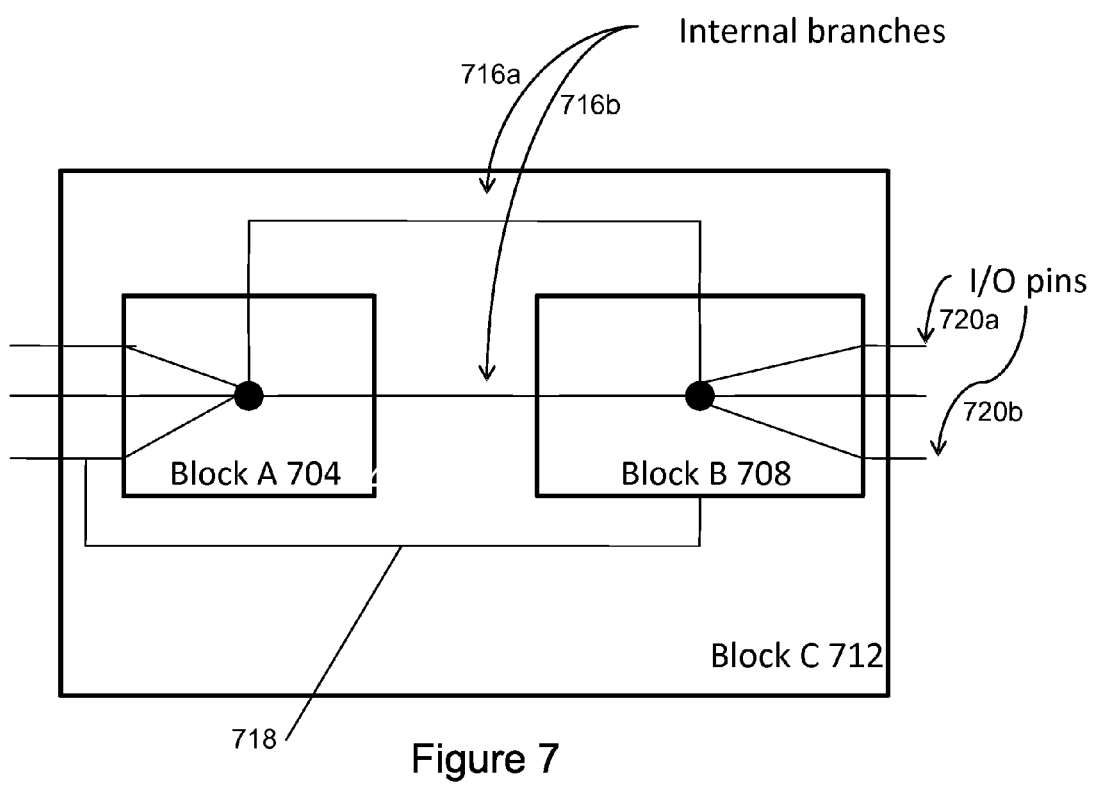
FIG. 7 shows interconnected blocks with a Barycenter model.

In an implementation, blocks A 604 and B 608 are substituted with Barycenter models, and the network is solved. FIG. 7 shows interconnected blocks with Barycenter models for blocks A and B. A block A 704 (Barycenter model) and a block B 708 (Barycenter model) are interconnected within a block C 712. Internal branches 716a and 716b connect blocks A and B at their center points. A value calculated in block A can be transmitted to block B via internal branch 716a. Further, an output of block A can be received as input to block B via internal branch 716b. There is also a feedback path 718 from block B back to an I/O pin of block A. Connections between blocks A and B may be referred to as intrablock branches because that are branches or connections between the blocks.

Block B has I/O pins 720*a* and 720*b*. Block B is shown as having three I/O pins. However, a block can have any number of I/O pins. In other implementations, block B has one, two, five, or seven I/O pins.

In an implementation, block A 604 is substituted for block A 704, and block B 608 is substituted for block B 708.

Figure 8:
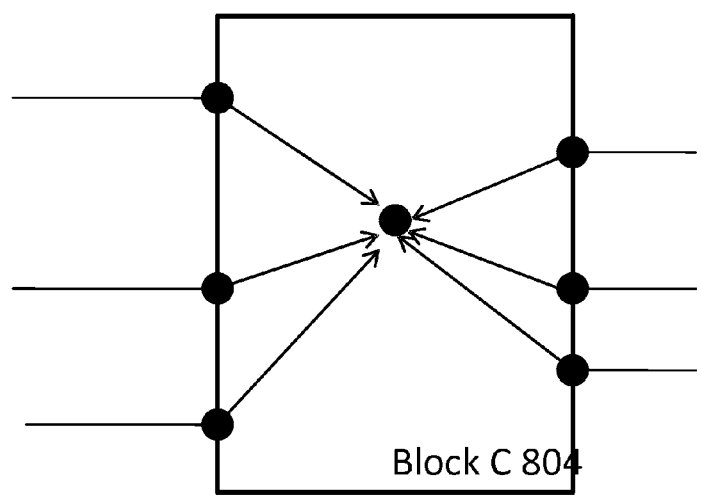
FIG. 8 shows a block diagram of a Barycenter compact model.

FIG. 8 shows a block diagram of a Barycenter compact model. The Barycenter compact model compacts all internal node information to boundary nodes and uses this model to represent the box model. An advantage of this model is that it physically represents I/O boundary models of the black box. A block C 804 is generated with the Barycenter compact model. Note that the internal branches and feedback path can be modeled by (or collapsed into) a single Barycenter compact model. This facilitates ease in handling, making calculations simpler, and allows for higher speed calculations.

Figure 9:
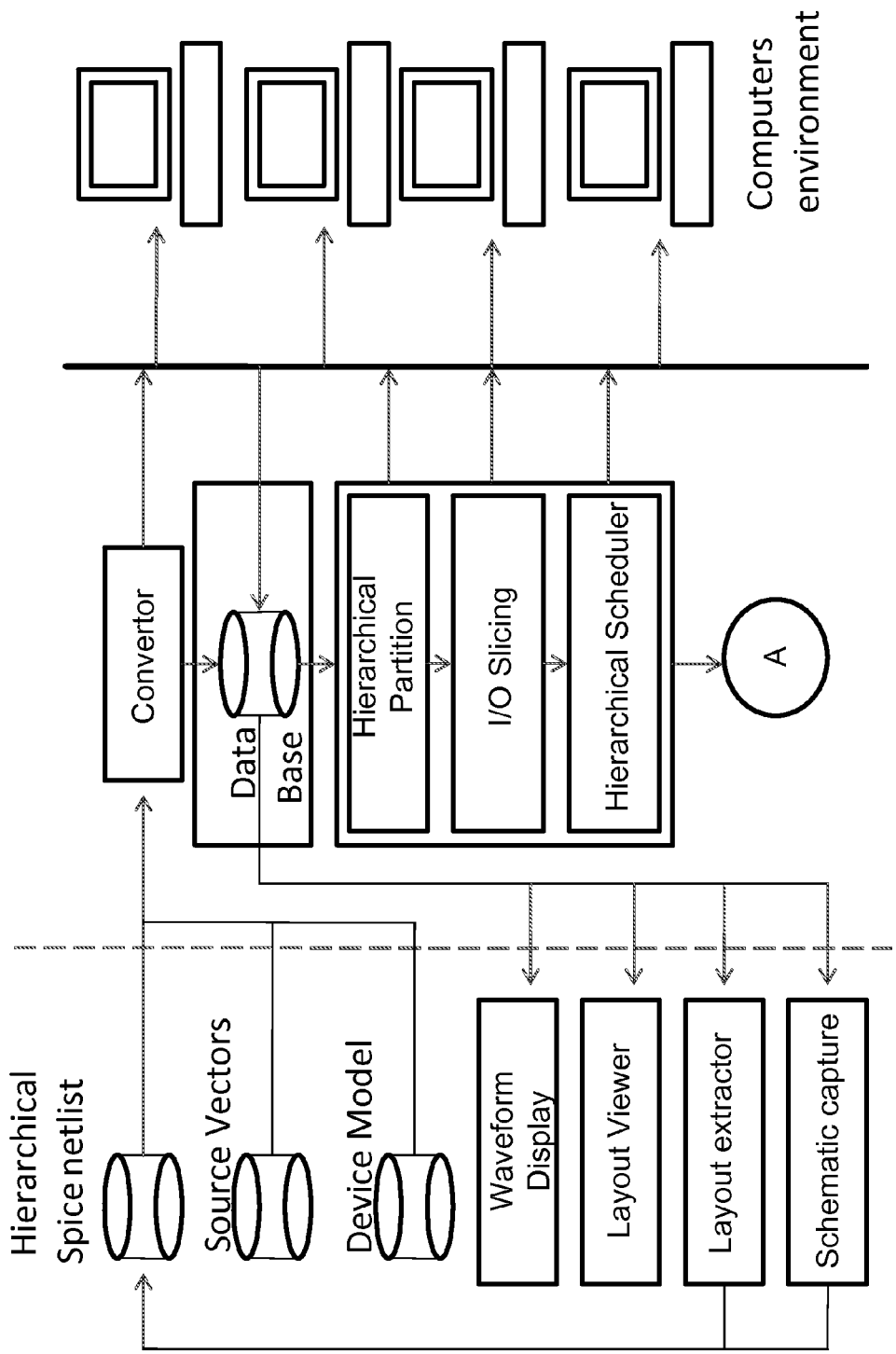
FIG. 9 shows a graphical diagram of a system environment input.

FIG. 9 shows a graphical diagram of a system environment input. In an implementation, computers environment can be multicore, networked or grid computing.

In a specific implementation, the database is a hierarchical database. An electronic circuit design may be provided as a hierarchical Spice netlist. The user may provide source vectors for use in evaluating the design; and device models to give transistor, impedance, or other physical characteristics of components of the electronic design.

In an implementation, the user can supply a schematic capture, and this can be used to generate the circuit netlist. There is a layout file or database, such as supplied as a GDS2 file. The layout provides the physical geometries of the electronic circuit design. This layout is used to generate the masks for the manufacture of an integrated circuit with the electronic circuit design. A layout viewer can view the layout graphically on a display. A layout extractor extracts the parasitics from the layout and associates it with corresponding nodes in the netlist. Other analysis tools may be used to view or evaluate the results of an output of this system, such as using a three-dimensional layout viewer.

With the netlist, this is converted by a convertor to database for handling. Processing include hierarchical partitioning, input-output (I/O) slicing, and hierarchical scheduling.

Figure 10:
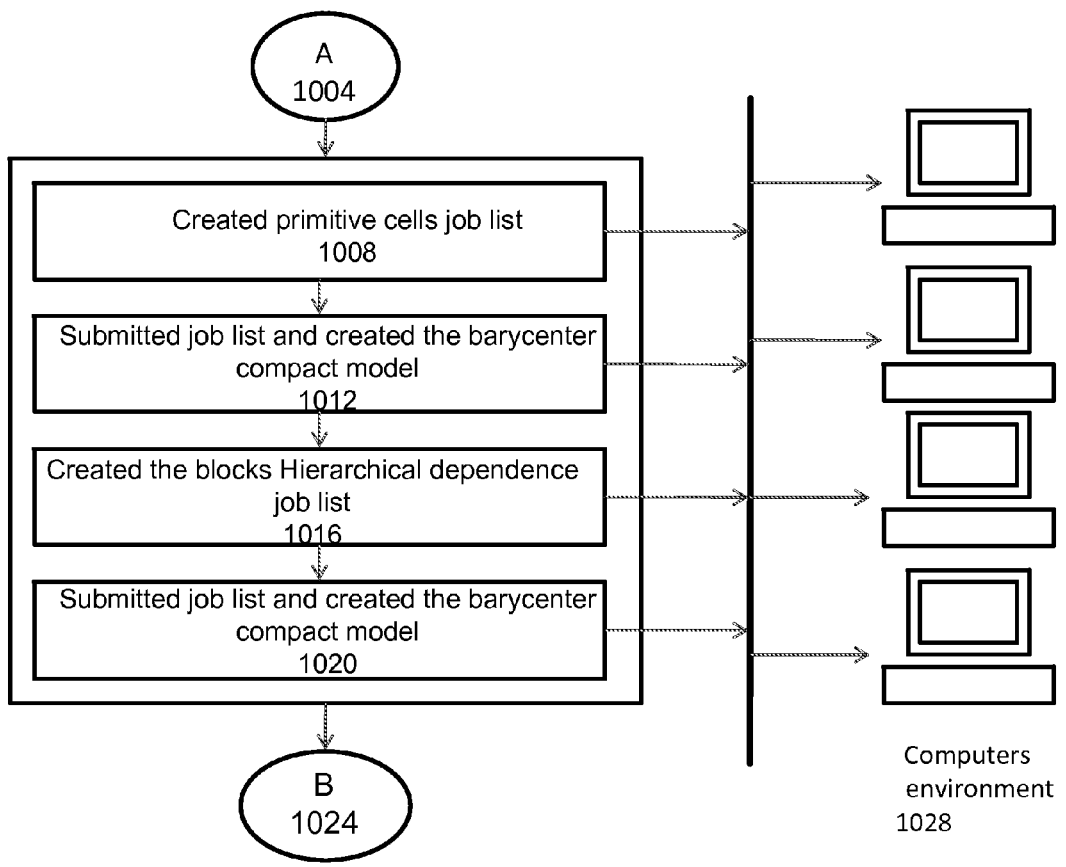
FIG. 10 shows a flow for a bottom up calculation.

FIG. 10 shows a flow for a bottom up calculation. A specific implementation of a bottom up calculation begins at a first step A 1004 and proceeds to a step 1008. At step 1008, a primitive cells job list is created. At a step 1012, a job list is submitted and a Barycenter compact model is created. At a step 1016, blocks hierarchical dependence job list is created. At a step 1020, a job list is submitted and a Barycenter compact model is created (same step as 1012). At a step 1024, the bottom calculation is completed. The output of these steps can be submitted to computers environment 1028.

Figure 11:
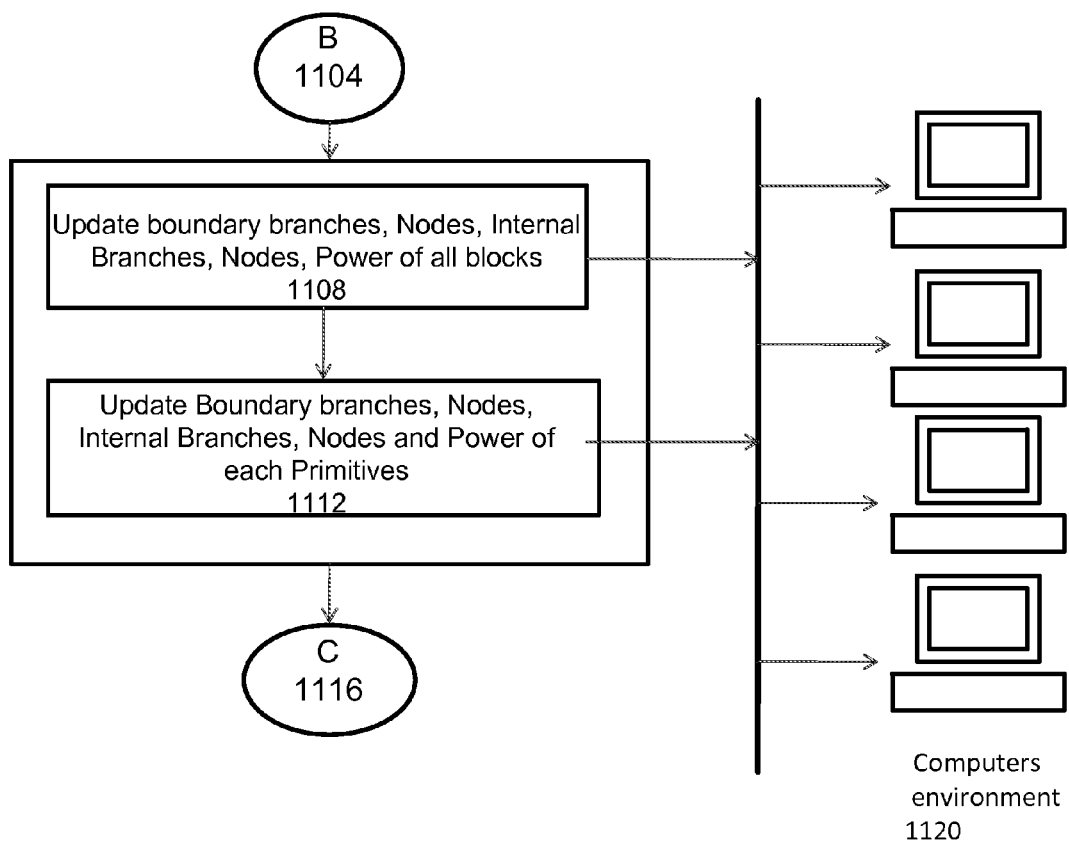
FIG. 11 shows a flow for a top down update.

FIG. 11 shows a flow for a top-down update. A specific implementation of a top down update begins at a first step B 1104 and proceeds to step 1108. At a step 1108, boundary branches, nodes, internal branches, nodes, and power of all blocks are updated. At a step 1112, boundary branches, nodes, internal branches, nodes, and power of each primitive are updated. At a step 1116, the top down update is completed. The output of these steps can be submitted to computers environment 1120.

Figure 12:
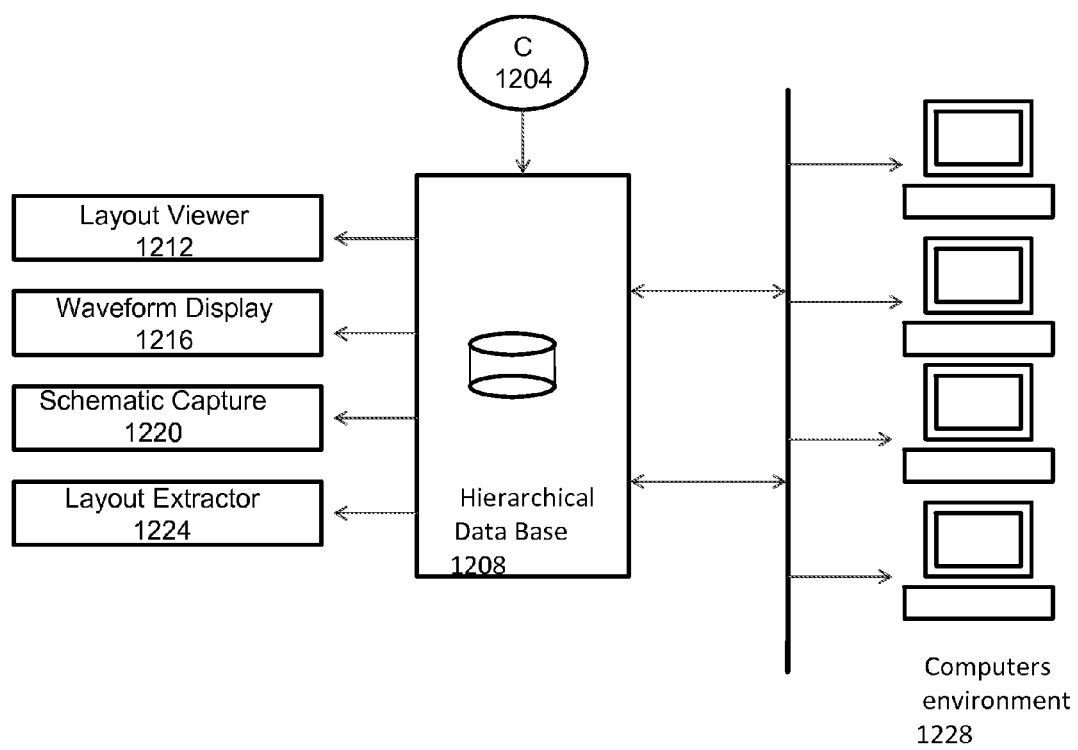
FIG. 12 shows a flow of an output.

FIG. 12 shows a flow of an output. The flow starts at a first step 1204, and proceeds to a step 1208 in which data from a database 1208 is retrieved. In a specific implementation, the database is a hierarchical database. At a step 1212, a layout view extracts data from the database. At a step 1216, data is extracted from the database and a waveform is displayed by a waveform displayer. At a step 1220, data is extracted from the database and a schema is captured by a schematic capture. At a step 1224, data is extracted from the database and a layout is extracted by a layout extractor. Further, data from the database can be transmitted and received to and from computers environment 1228.

Figure 13:
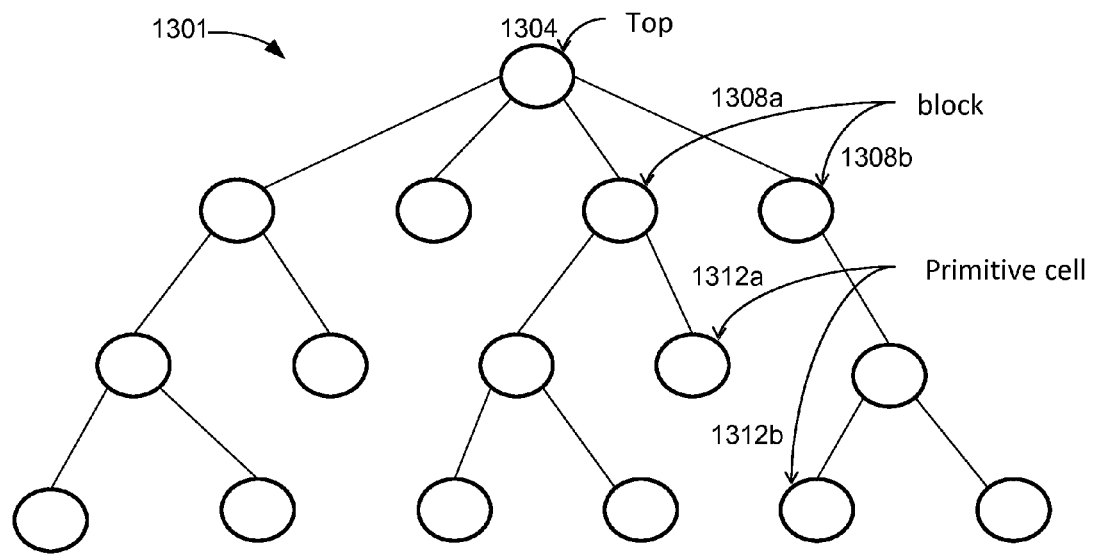
FIG. 13 shows a specific implementation of a hierarchical partition.

FIG. 13 shows a specific implementation of a hierarchical partition 1301. The hierarchical partition has a top 1304, blocks 1308*a* and 1308*b*, and primitive cells 1312*a* and 1312*b*. The hierarchical partition is shown as having four levels. However, the hierarchical partition can have more than four levels or less than four levels. For example, the hierarchical partition can have three, five, seven, or eight levels. Further, a hierarchical partition can have any positive number of blocks or primitive cells. Any partitioning technique can be used to generate a hierarchical structure. Some examples include Binary, Quart Tree, K-d tree, Bin, and so forth.

Figure 14:
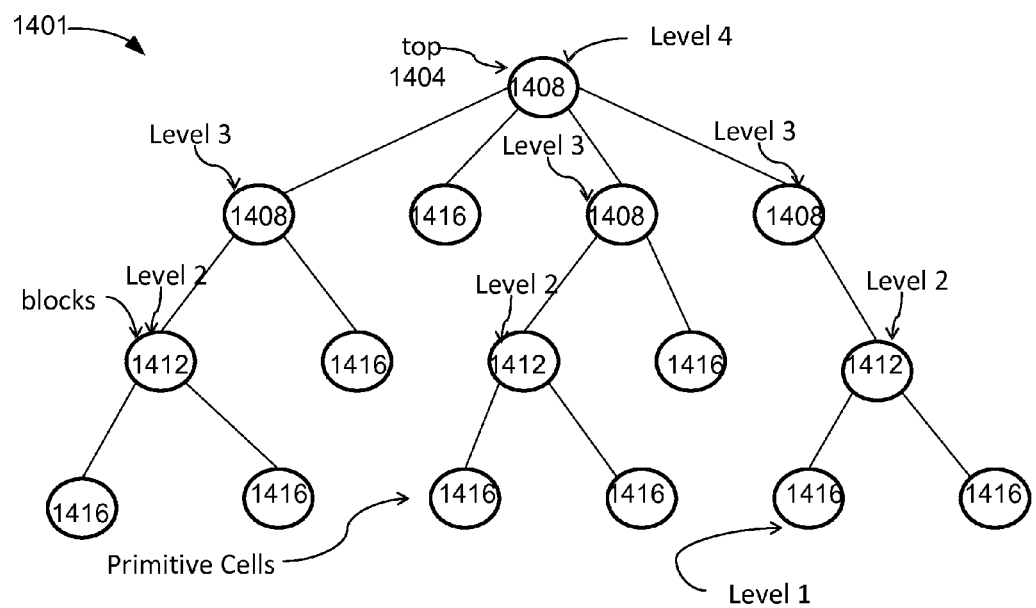
FIG. 14 shows a hierarchical tree scheduler.

FIG. 14 shows a hierarchical tree scheduler. The figure shows a specific implementation of a hierarchical dependence tree 1401 with four levels. A top 1404 of the hierarchical dependence tree is at a level 4 (1408). As indicated, three blocks are at a level 3 (1408). As indicated, three blocks 1412 are at a level 2 (1412). The remaining eleven primitive cells are at a level 1 (1416). There can be any number of primitive cells or blocks.

Figure 15:
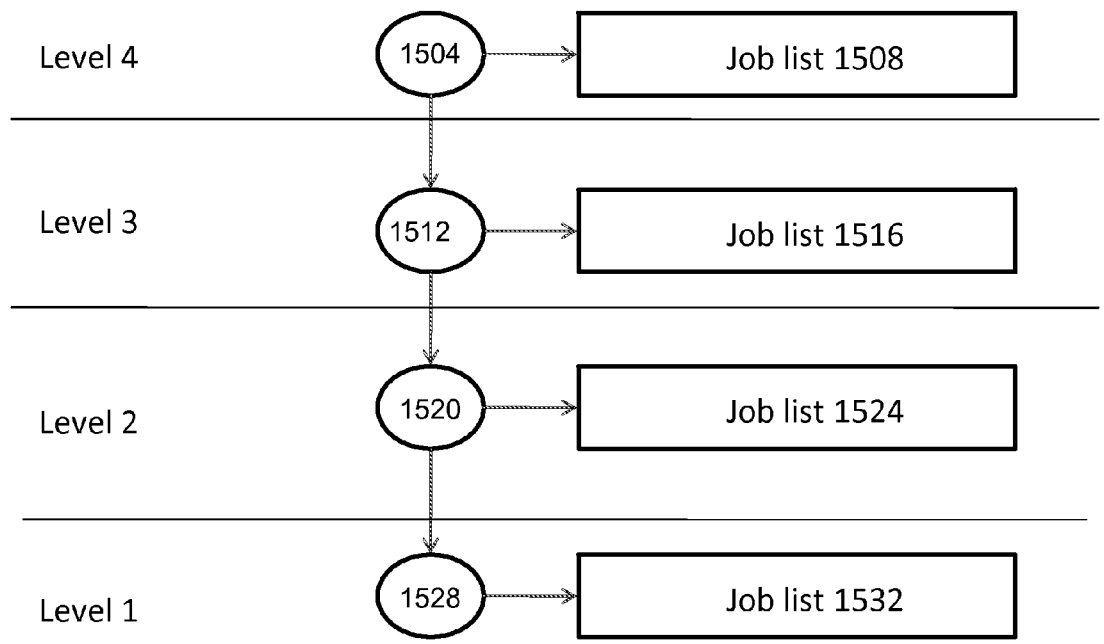
FIG. 15 shows a hierarchical dependence scheduler.

FIG. 15 shows a hierarchical dependence scheduler. At a level 4, block 1504 transmits jobs to job list 1508 and can also transmit data to block 1512. At a level 3, block 1512 transmits jobs to job list 1516 and can also transmit data to block 1520. At a level 2, block 1520 transmits jobs to job list 1524 and can also transmit data to block 1528. At a level 1, block 1528 transmits jobs to job list 1532. In a specific implementation, each job in the same level is fully independent.

In this scheduler, calculations occur in a top down fashion, so level 4 first (by job list 1508), then level 3 (by job list 1516), then level 2 (by job list 1524), and then level 1 (by job list 1532).

Figure 16:
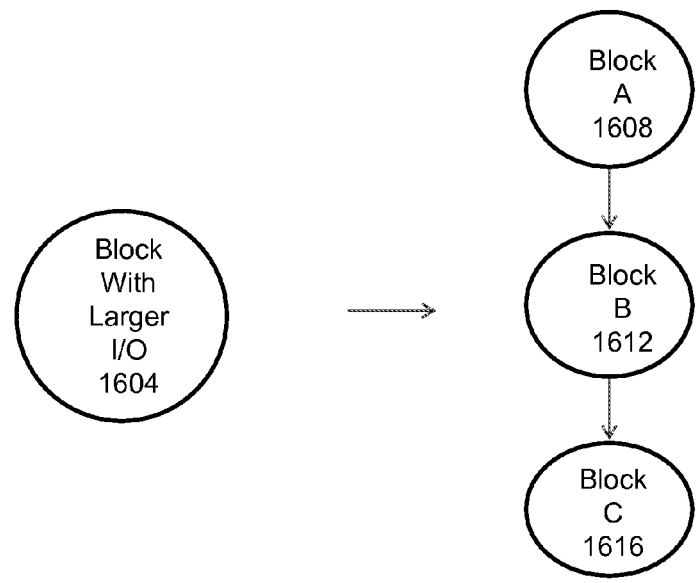
FIG. 16 shows a large I/O slicing into smaller I/O blocks.

FIG. 16 shows a large I/O slicing into smaller I/O blocks. A block with larger I/O 1604 slices a large I/O block into hierarchical less I/O blocks. Block 1604 transmits data to a block A 1608, block B 1612, and block C 1616, and block A 1608 can transmit data to block B 1612 which can transmit data to block C 1616. In an implementation, the usage of main memory size is controlled to fit the computer system memory limitation.

Figure 17:
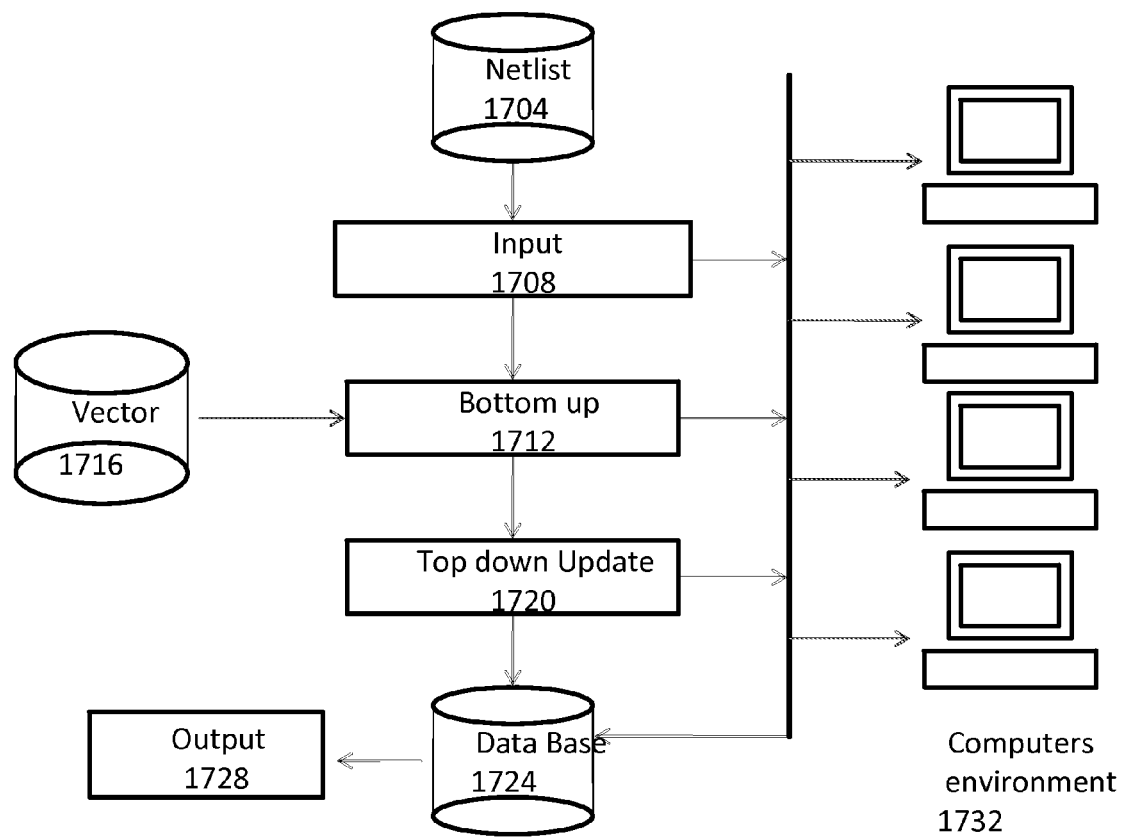
FIG. 17 shows a flow diagram of a static simulation.

FIG. 17 shows a flow diagram of a static simulation. The simulation begins at a step 1704 in which a netlist database is provided. At a step 1708, data from the netlist database is used as input. In an implementation, the input is a netlist parser, netlist hierarchical partition to generate primitive cells and blocks with an I/O boundary, netlist I/O slicing to create a next hierarchical level for a large I/O boundary, or a hierarchical job scheduler and hierarchical data base. At a step 1712, the input is used as input into a bottom up calculation.

During the bottom-up calculation, a primitive cells job list can be created or primitive cells job list in parallel (multicores) or distributed network computing can be submitted and the primitive cells equivalent model using direct solver simultaneously can be generated. Further, a dependence job list of the blocks using a hierarchical scheduler can be created, and a job list of blocks in parallel (multicores) or distributed network computing can be submitted and the equivalent I/O model using direct solver simultaneously can be generated.

At a step 1720, a top down update is performed. In an implementation, during this step, boundary and internal branch current, nodal voltage and power of blocks in parallel (multicores) or distributed network computing are updated simultaneously. Further, all boundary and internal bench current, bench voltage and power of primitive cells in parallel (multicores) or distributed network computing are updated simultaneously. In other implementations, they are not updated simultaneously.

At a step 1724, a result of the top down update is stored in a database. At a step 1728, data is extracted from the database and is output. Output can be branch currents, branch voltages, nodal voltages, block power, or branch power. Further, output can be a waveform display, layout mapping display, highlight EM problems, highlight static and dynamic IR drop, signal noise, signal timing, signals cross talk, and power consuming. Computers environment 1732 can be multicores and networked.

Figure 18:
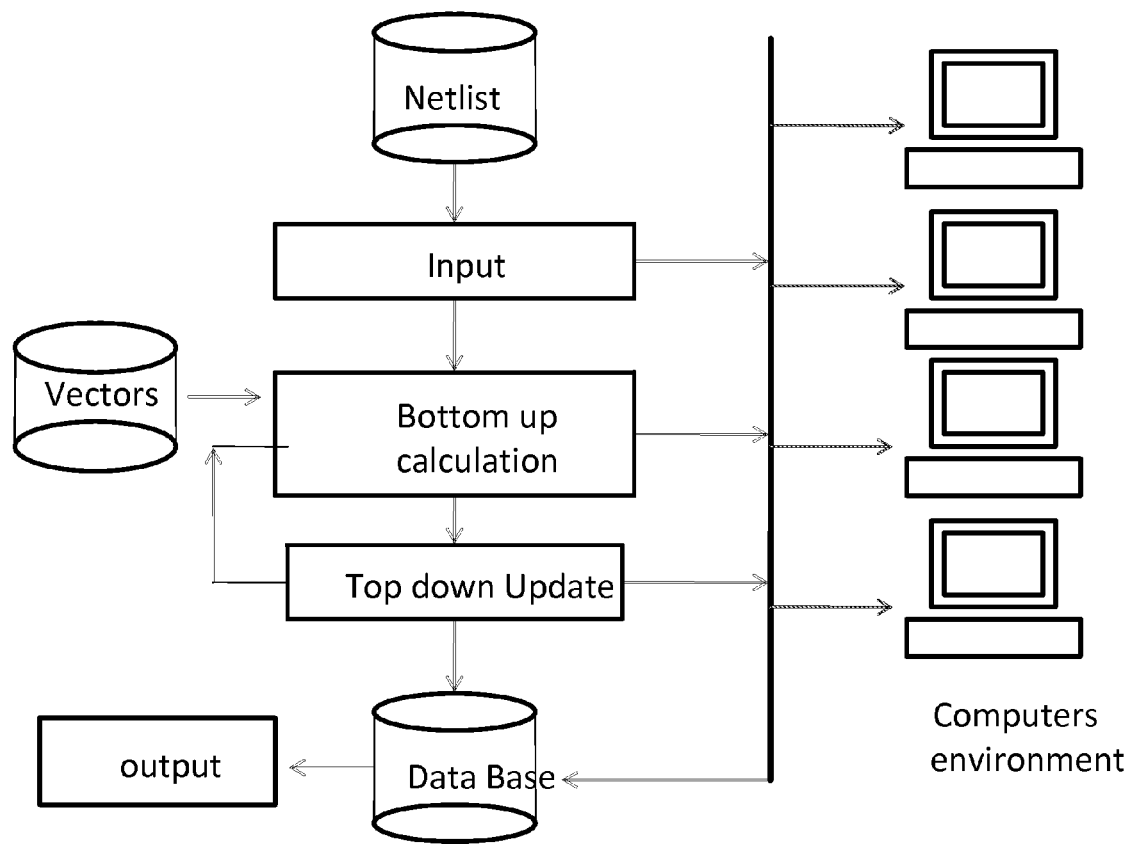
FIG. 18 shows a flow diagram of a dynamic simulator.

FIG. 18 shows a flow diagram of a dynamic simulator.

Figure 19:
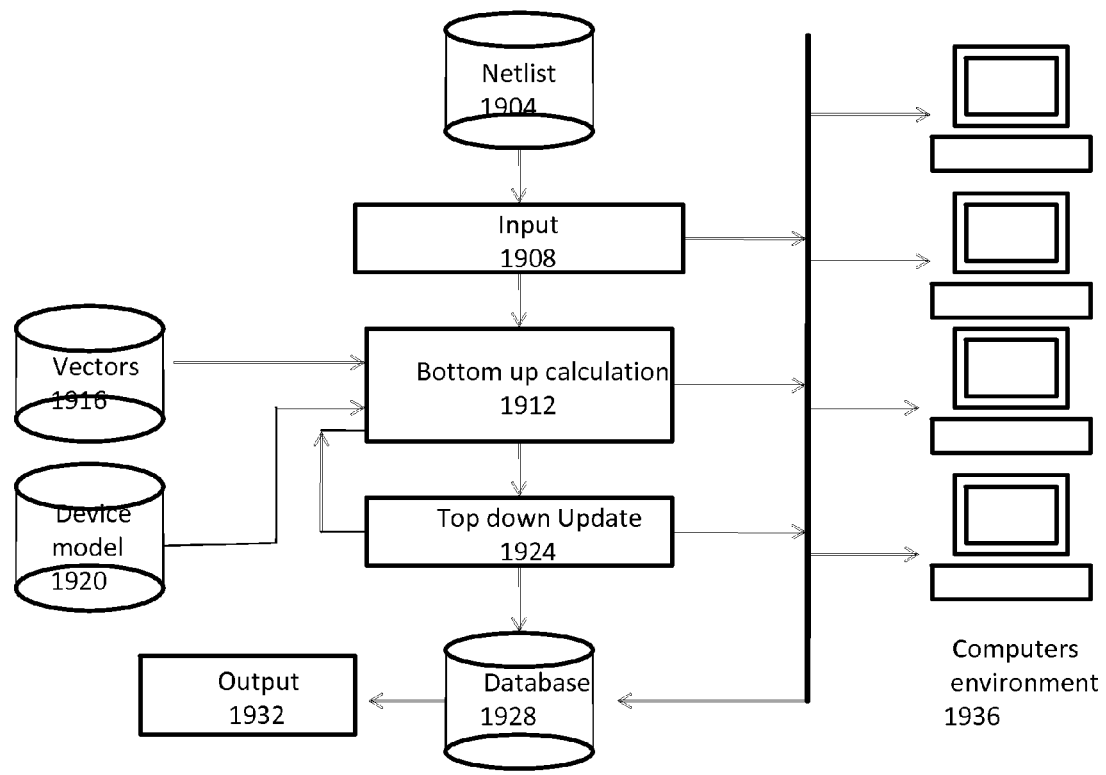
FIG. 19 shows a flow diagram of a circuit simulator.

FIG. 19 shows a flow diagram of a circuit simulator. The simulation begins at a step 1904 in which a netlist database is provided. At a step 1908, data from the netlist database is used as input. At a step 1912, vectors from a database 1916, device models from a database 1920, and updates from a top down update are used to perform a bottom up calculation. At a step 1924, an output of the bottom up calculation is used to perform a top down update. At a step 1928, a result from the top down update is stored in a database. At a step 1932, data is extracted from the database and is output.

Using the Barycenter model and hierarchical scheduler, the nonlinear device model can be integrated into the system. Further, using the Newton-Raphson method, the nonlinear boundary problems can be solved.

In an implementation, the invention has several advantages, such as no memory sharing, ability to control the usage of memory size, fully utilizing all CPUs power linearly, ease in programming in a parallel and distributed computing system environment, faster performance and capacity, and if a direct matrix solver is used, the exact answer can be calculated regardless of the different partitions.

U.S. patent application Ser. Nos. 11/421,206 and 11/421,212, both filed May 31, 2006, describe network tearing and global and local links. The network tearing techniques described in those patent applications can be used in conjunction with the techniques described in this patent application to solve circuit networks of hierarchical electronic circuit designs.

Figure 20:
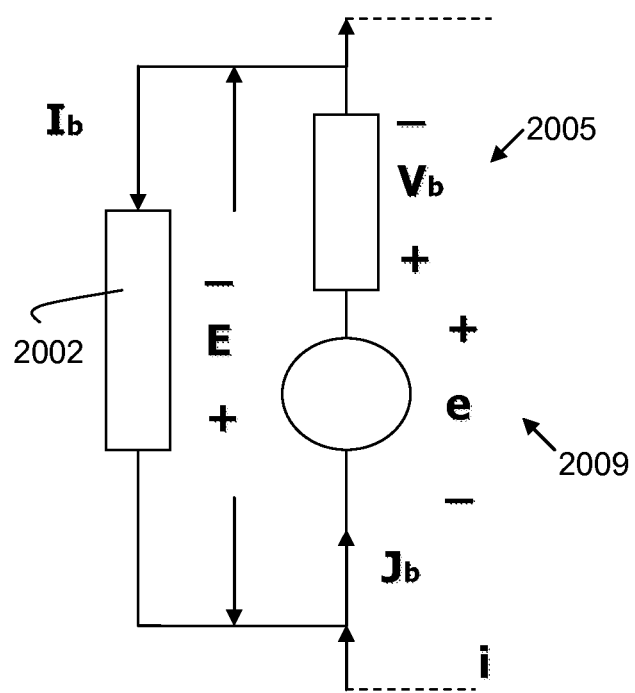
FIG. 20 shows an example of a branch of a circuit.

FIG. 20 shows an example of a branch of a circuit. This branch has a current source 2002, impedance or admittance 2005, and voltage source 2009. In electrical engineering, the admittance (Y) is the inverse or reciprocal of impedance (Z). There are also currents $I_b$ and $J_b$.

A circuit component is represented using a branch such as shown in FIG. 7. More specifically, each tree branch represents resistance-capacitance-inductance (RCL) and one or more sources, such as current source, voltage source, dependent current source, and dependent voltage source. As discussed above, a device model for a transistor or other device is a RCL network with a dependent source. Therefore, each transistor of the circuit will be a branch in the network graph. The entire graph is a RCL network with sources.

Figure 21:
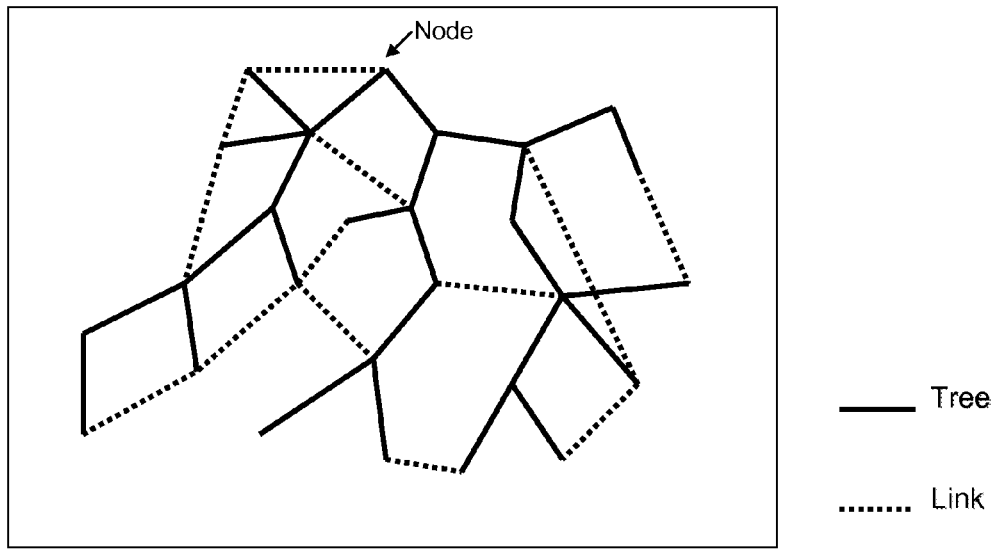
FIG. 21 shows a graph of a tree and links.

FIG. 21 shows a graph of a tree and links. Tree branches are shown using solid lines, and links are shown using dotted lines. At a junction (or intersection) of two or more tree branches is a node. In a graph, some information is associated with each node and edge. For example, a node of the graph may be a node in the circuit and edge may be a branch in the circuit. A graph is an abstract data type that consists of a set of nodes and a set of edges that establish relationships or connections between the nodes. A specific technique, among others, to implement a graph data structure is to use linked lists over the nodes and the ingoing and outgoing edges of the nodes. Another technique to implement a graph is to use an array structure. There are many other approaches to implementing a graph data structure in a computer system, and any of these may be used.

After a graph of the circuit is built, a technique identifies branches and links of the tree. A tree of a graph is a connected subgraph that includes all the nodes of the graph but contains no loops. A loop is a circular path from a first node through other nodes and returns to the first node. A loop has a voltage drop of zero. A subgraph of a graph is a set of branches and nodes belonging to a graph. A link forms a loop with one or more tree branches, and may be referred to as a unit link. A tree branch does not form a loop. Typically, a circuit or system has one tree and multiple links. FIG. 21 shows an example of a graph with nodes, branches, and links A circuit network is represented using such a graph data structure.

For a hierarchical circuit design, a node of the graph may be a subcell or subcircuit of the hierarchical circuit design. Nodes at the lowest level (or bottom level) of the hierarchy may be referred to as primitives or leafs.

There are many techniques to identify trees and links One approach is a depth first search. Another technique is a breadth first search. Either of these may be used or a combination of these two may be used. For example, one technique of finding a tree involves starting at a starting node. This node can be any node in the graph. Depending on which node is selected as the starting node, the tree may be different from a tree found using a different starting node. Proceeding branch by branch through the graph, each branch of the graph will be designated as a tree or link to create a graph, such as in FIG. 8, having tree branches and links.

Partitioning the tree into subtrees breaks up or tears a tree into smaller subtrees. In an embodiment of the invention, partitioning the tree breaks up the tree into a number of subtrees with the same or close to the same number of tree branches. Each subtree is a subcircuit of the complete circuit. This technique may be automated using, for example, a computer. In particular, a number count or predefined count may be selected, such as two, three, four, five, six, seven, eight, ten, more than ten, and so forth. Smaller counts are used to break the tree into more subtrees than for larger counts.

According to one technique, a first subtree is formed by repeatedly adding branches of the tree to the first subtree when a number of branches in the first subtree is less than a predefined count and there are branches in the tree which have not yet been assigned to a subtree. This technique is continued with the second subtree, third subtree, and so forth until all branches of the tree have been assigned to a subtree. Each branch of the tree is only assigned to one subtree. Each subtree is a tree with connected branches. Using this counting approach, each subtree will have a number of branches less than or equal to the predefined count. The predefined count may be set by the system, or may be user defined. This technique can be used for flat electronic designs or designs where hierarchy need not be maintained (where the hierarchy can be flattened).

For a hierarchical circuit design, an approach to partitioning the tree into subtrees (while maintaining the hierarchy) is to recursively partition the tree into smaller and smaller subtrees while a number of branches of each succeeding subtree is greater than a predefined partition size. More specifically, a tree is partitioned into a number of subtrees. The size of each subtree is checked against the predefined partition size. If the size of a subtree is larger than the predefined partition size (e.g., greater number of branches than the predefined partition size), that subtree is partitioned again. This technique is applied recursively for each succeeding subtree obtained, until each of the resulting subtrees is equal to or smaller than the predefined partition size.

The predefined partition size may be defined by the user, such as in a parameter file read by software before or during runtime. Recursive partitioning maintains the hierarchy in a system graph of the electronic circuit design. In an implementation, the recursive partitioning routine continues until the subtree size is smaller than the defined partition size or close to the predefined partition size in case when a primitive cell is obtained that cannot be further partitioned.

In another implementation, an initial system graph is divided or broken into a number of instances before the recursive partitioning. Each instance is a subtree. The number of instances is predefined, and can be user defined similarly to the predefined partition size. The number of instances may be related to the number of processors or processing cores available. For example, for a quad-core processor, the number of instances selected may be four. For eight cores (available on a single machine or multiple machines together), the number of instances may be 8. For a 64-core system, the number of instances may be 64, and so forth. Then, each of the instances (which is a subtree) is then recursively partitioned while a number of branches of each succeeding subtree is greater than a predefined partition size.

For a hierarchical circuit design, nodes at the lowest level (or bottom level) of the hierarchy may be referred to as primitives or leafs. In a typical hierarchical circuit design, there can be any number of primitive cells, and there are multiple instances of a primitive cell.

Figure 22:
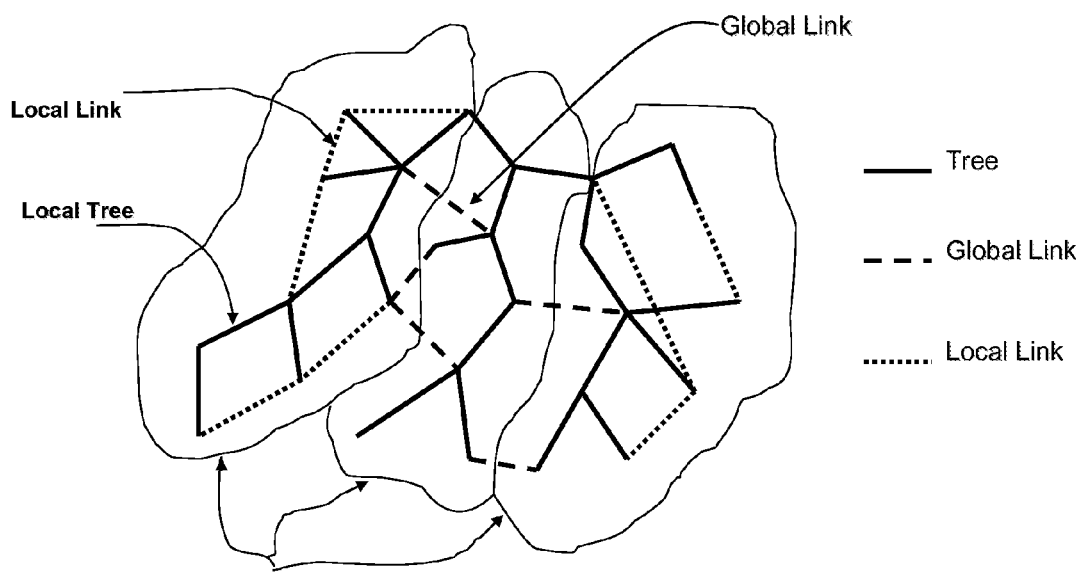
FIG. 22 shows local trees, global links, and local links of a graph.

For example, FIG. 22 shows the tree of FIG. 21 partitioned into three subtrees (also may be called local trees or subblocks), where the subtrees have 8 or 9 branches. As a further example, if the count is two, a tree is separated every two tree branches until it can no longer be subdivided. If there are an odd number of branches in the tree, then the last subtree will have one branch, rather than two.

Described above is merely an example of some techniques of partitioning. Other techniques may be used to partition the tree into subtrees, and any of these other techniques may also be used in implementing the invention.

A technique determines which links are local are which are global. In FIG. 22, tree branches are shown using solid lines, global links are shown using broken lines, and local links are shown using dotted lines. A link that forms a loop in a subtree is a local link. A link that forms a loop in two or more subtrees (or multiple subtrees) is a global link. A global link forms a loop with branches of two or more subtrees.

FIG. 9 shows a tree having three subblocks. For ease in identifying subblocks in the figure, each subblock is circled with a boundary line. Each subblock has a local tree and local links. The local links for a particular subblock are located within the subblock and do not cross a subblock boundary line. There are global links between subblocks and local trees. The global links cross the subblock boundary lines.

A subblock solver will solve each subblock including local links, but not global links. During this step, a circuit subblock is simulated while circuit branches between subblocks (i.e., global links) are ignored. The subblock solver will take individual subtrees or subblocks and solves each of these subtrees or subblocks independently.

Therefore, a solution to any particular subblock may be determined without considering other subblocks. So, it will be immaterial in what the order the subblocks are simulated. This helps a distributed computing embodiment of the invention because by allowing each subblock to be simulated independently, there will not be any scheduling problems. The solver determines the IR drop (current-resistance drop) or voltage drop for each branch or local link, or both. In other words, the solver determines the voltage and current for each branch for the given conditions. To determine the IR drops, the computer will perform a matrix inversion or LU (lower-upper) factoring of a subblock in the tree network. The subblock which is solved includes branches and local links, but not global links.

With an embodiment of a system of the invention, a single computer may perform computations for each subblocks in sequence. Since the subblock is much smaller than the matrix of the entire tree, computation time is reduced. In further embodiments, multiple computers may perform computations for subblocks at the same time, reducing simulation time compared to using one computer or solving a very large matrix for the whole tree.

More specifically, the subblock solver can send each of the subtrees as a computing task or job to be solved by a different computer in a distributed computing network. If there are too few computers to do all jobs simultaneously, two or more tasks may be queued up on a computer for computer. In such fashion, different computers in the distributed computing network can perform parts of circuit simulation calculations in parallel, thus further speeding up the circuit simulation process.

An interblock solver will solve the IR drop or voltage drop for the global links, which are the links or interconnection between the blocks. The interblock solver determines the junction voltage or junction current, or both, for each global link. The junction voltage is the voltage across the global link, and the junction current is the current which flows through the global link. The results of the interblock solver will be independent of the results of subblock solver. So, the interblock solver does not use the results from the subblock solver. Interblock solver may be performed using a single computer or distributed computing.

A technique combines the partial results with the interconnect-level results (obtained using the interblock solver) to find the exact or real results for the entire circuit. Update system partial results updates the system results with the contribution of the global links to each subtree. In an implementation, the results obtained after update system partial results will be the real solution for the whole system, as if the system were solved together as one large matrix. This real solution will not be an estimation, approximation, or an iteratively obtained solution, but an exact solution.

An output block outputs the IR drop results into database. For each node, there may be a nodal voltage, branch voltage, and branch current. Branch voltage is the voltage across the two nodes of a branch. Given the nodal voltages, the branch voltage may be calculated. Branch current is the current flowing through a branch.

Some specific flows for circuit simulation are presented in this patent, but it should be understood that the invention is not limited to the specific flow and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data In an implementation, a system includes:
1. A network.
2. A number of computing devices, connected to the network.
3. A circuit simulation block including:
3a. A system tearing block to identify each branch of a given resistance-capacitance-inductance (RCL) circuit network graph as at least one of a tree branch or a link, where the tree branches form a tree of the graph, and the tree includes no loops.

3b. Divide the tree into at least a first subtree instance and a second subtree instance, where each the first and second subtree instances includes no loops, and 3c. Identify links of the given RCL circuit network graph as at least one of a global link or a local link, where a global link forms a path from a branch of the first subtree to a branch of the second subtree, a global link forms a loop with branches of the first and second subtrees, the first subtree is recursively partitioned to obtain i subtrees while a number of branches of each of the i subtrees is greater than a predefined partition size, and the loop with the global link and branches of the first and second subtrees has a voltage drop of 0; and 3d. A subblock solver block to send an i subtree, without any global links, through the network to a first computing device of the plurality of computing devices for calculation and an i+1 subtree, without any global links, through the network to a second computing device of the plurality of computing devices for calculation.

Further, the second subtree can be recursively partitioned to obtain j subtrees while a number of branches of each of the j subtrees is greater than the predefined partition size. The subblock solver block is to send a j subtree, without any global links, through the network to a third computing device of the computing devices for calculation and a j+1 subtree, without any global links, through the network to a fourth computing device of the plurality of computing devices for calculation.

Each of the i subtrees is modeled by a block including: boundary nodes; boundary branches, one boundary branch connected to each boundary node; and a center point node connected to each of the of the boundary nodes through, at most, a single boundary branch.

In an implementation, a method includes:

1. Recursively partitioning a system graph of an hierarchical electronic circuit design into subcells while a number of branches in each of the subcell is greater than a predefined partition size, where subcells at a lowest level in a tree of the system graph are referred to as primitive cells. The hierarchical electronic circuit design may be specified using a hierarchical netlist.

2. Converting each of the subcells into corresponding model blocks, each model block including: boundary nodes; boundary branches, one boundary branch connected to each boundary node; and a center point node connected to each of the of the boundary nodes through, at most, a single boundary branch.

3. Determining initial value solutions for primitive cells using model blocks for the primitive cells.

4. Assembling the primitive cells in a hierarchical fashion from a bottom to a top of the tree to obtain an assembled structure which maintain the hierarchy of the hierarchical electronic circuit design.

5. Determining boundary conditions for the subcells.

6. Using the determined initial value solutions for the primitive cells, calculating initial value solutions for each subcell from a bottom to a top of the assembled structure.

8. Using the determined boundary conditions, calculating boundary value solutions for each subcell from a top to a bottom of the assembled structure.

The calculating initial value solutions for each subcell from a bottom to a top of the assembled structure can include: calculating a solution to each subcell while ignoring global links, where a global link forms a path from a branch of a first subcell to a branch of a second subcell, and a loop with the global link and branches of the first and second subcells has a voltage drop of 0.

The method may further include building an input-output connectivity of the assembled structure.

The assembling the primitive cells in a hierarchical fashion from a bottom to a top of the tree to obtain an assembled structure may include:

1. Providing a first model block, including first boundary nodes connected via first boundary branches to a first center point node, corresponding to a first subcell.

2. Providing a second model block, including second boundary nodes connected via second boundary branches to a second center point node, corresponding to a second subcell;

3. Determining a hierarchical connectivity between the first and second model blocks from the system graph tree includes an intrablock branch, the intrablock branch including at least one of:

3a. A first intrablock branch connecting the first center point node of the first model block to the second center point node of the second center point node, 3b. A second intrablock branch connecting one of the first boundary branches of the first model block to one of the second boundary branches of the second model block, OR 3c. A third intrablock branch connecting the second center point node of the second model block to one of the first boundary nodes of the first model block.

4. Obtaining a third model block corresponding to the first and second model blocks and determined hierarchical connectivity, where the third model block includes third boundary nodes connected via third boundary branches to a third center point node, where the third center point node is connected to each of the third boundary nodes through, at most, a single third boundary branch.

In an implementation, a method includes:

1. Providing a hierarchical system graph of an electronic circuit including multiple instances of at least one primitive.

2. Identifying each branch of the system graph as at least one of a tree branch or a link, where the tree branches form a tree of the system graph without flattening a hierarchy of the system graph.

3. Dividing the tree into n subtree instances including at least first and second subtree instances, where n is predefined number of instances having an integer value 2 or greater.

4. Identifying links of the system graph as at least one of a global link or a local link, where the system graph includes both global and local links, a global link forms a path from a branch of the first subtree instance to a branch of the second subtree instance, and a loop with the global link and branches of the first and second subtrees has a voltage drop of 0;

5. Recursively partitioning the first subtree instance into i subtrees while a number of branches of each of the i subtrees is greater than a predefined partition size, where the partition size is defined separately from the number of instances.

6. Identifying links forming a path between branches of the i subtrees of the first subtree instance as global links.

7. Recursively partitioning the second subtree instance into j subtrees while a number of branches of each of the j subtrees is greater than the predefined partition size.

8. Identifying links forming a path between branches of the j subtrees of the second substree instance as global links.

The recursive partitioning the first subtree instance into i subtrees while a number of branches of each of the i subtrees is greater than a predefined partition size does not include flattening the hierarchy of the system graph. Therefore, the hierarchy of the system graph of the electronic circuit is maintained. This speeds up calculations because primitive cells need only be simulated once and then assembled together. When flattened, the hierarchy is lost and instances of the primitives are recalculated each time. Some primitives, such as an inverter, may be repeated many times in an electronic or integrated circuit design. Therefore, in an implementation, each of the i subtrees of the first subtree instance and j subtrees of the second subtree instance maintains the hierarchy of the system graph of the electronic circuit.

Further, calculating a solution to each of the i subtrees initially ignores global links, and calculating a solution to each of the j subtrees initially ignores global links. Calculating a solution to one of the i subtrees is performed on a different computing device than calculating a solution to one of the j subtrees. This facilitates distributed computing. Calculating a solution to each of the i subtrees while ignoring global links can include performing a matrix inversion. Calculating a solution to each of the i subtrees while ignoring global links can include performing LU factoring.

A local link forms a loop in one of the i subtrees of the first subtree instance. A tree branch forms no loops in the system graph. A link forms a loop in the system graph. Each of the i subtrees is modeled by a block including: boundary nodes; boundary branches, one boundary branch connected to each boundary node; and a center point node connected to each of the boundary nodes through, at most, a single boundary branch.

The system may optionally include a self-verification tool. The self-verification tool may be included in some embodiments, while it is omitted in other embodiments of the invention. The self-verification takes the simulation results of verifies the results are correct. U.S. patent application Ser. No. 11/279,391, filed Apr. 11, 2006, issued as U.S. Pat. No. 7,461,360 on Dec. 2, 2008, discusses simulation verification and is incorporated by reference along with any other references cited in this application. A technique of simulation verification involves determining whether the simulation results obtained satisfy Kirchhoff's current law (KCL), Kirchhoff's voltage law (KVL), and the power conservation law. If any of these three laws are not satisfied, a not-verified condition results, which means the calculated simulation results contain an erroneous. For example, if KCL is verified, but not KVL and not power, this results in a not-verified condition. If KCL and KVL are verified, but not power, this results in a not-verified condition. In an implementation, to obtain a verified condition, KCL, KVL, power must be verified, otherwise a not-verified condition results.

For example, a method may further include:

1. Using the calculated initial value and boundary value solutions, determining node voltages for each node of the hierarchical electronic circuit design.

2. Using the node voltages, determining branch voltages for branches in the system graph.

3. Identifying independent loops in the graph.

4. Summing the voltages for each independent loop in the graph.

5. Summing the currents at each node in the graph.

6. Summing power consumed for each branch in the graph to obtain a total power consumed.

7. Determining a total input power to the circuit network using the input sources associated with the circuit.

8. Subtracting the total power consumed from the total input power to obtain a total power difference.

9. Indicating a not-validated condition when at least one of the loops in the graph has a nonzero sum;

10. Indicating a not-validated condition when at least one of the nodes in the graph has a nonzero sum.

11. Indicating a not-validated condition when the total power difference is not zero.

In another implementation, a technique includes: providing a circuit network specified in a netlist format and input sources associated with the circuit; providing a simulation output for the circuit, where the simulation output includes node voltages for each node of the circuit; building a graph data structure from the circuit netlist; using the node voltages, determining branch voltages for branches in the graph; identifying a tree and links in the graph; identifying independent loops in the graph; summing the voltages for each independent loop in the graph; summing the currents at each node in the graph; summing power consumed for each branch in the graph to obtain a total power consumed; determining a total input power to the circuit network using the input sources associated with the circuit; subtracting the total power consumed from the total input power to obtain a total power difference; indicating a not validated condition when at least one of the loops in the graph has a nonzero sum; indicating a not validated condition when at least one of the nodes in the graph has a nonzero sum; and indicating a not validated condition when the total power difference is not zero.

In various implementations, a current for a branch is calculated by branch voltage divided by impedance for the branch. A validated condition is indicated when every loop in the graph sums to zero, every node in the graph sums to zero, and the total power difference is zero. In a graphical viewer, nodes of the circuit are highlighted where nonzero current summing results were obtained. In a graphical viewer, branches of the circuit are highlighted where nonzero voltage summing results were obtained.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:

providing a hierarchical system graph of an electronic circuit comprising multiple instances of at least one primitive;

identifying each branch of the system graph as at least one of a tree branch or a link, wherein the tree branches form a tree of the system graph without flattening a hierarchy of the system graph;

dividing the tree into n subtree instances comprising at least first and second subtree instances, wherein n is predefined number of instances having an integer value 2 or greater;

identifying links of the system graph as at least one of a global link or a local link, wherein the system graph comprises both global and local links, a global link forms a path from a branch of the first subtree instance to a branch of the second subtree instance, and a loop with the global link and branches of the first and second subtrees has a voltage drop of 0;

using at least one computer processor, recursively partitioning the first subtree instance into i subtrees while a number of branches of each of the i subtrees is greater than a predefined partition size, wherein the partition size is defined separately from the number of instances;

identifying links forming a path between branches of the i subtrees of the first subtree instance as global links;

using at least one computer processor, recursively partitioning the second subtree instance into j subtrees while a number of branches of each of the j subtrees is greater than the predefined partition size; and identifying links forming a path between branches of the j subtrees of the second subtree instance as global links.

2. The method of claim 1 wherein the recursively partitioning the first subtree instance into i subtrees while a number of branches of each of the i subtrees is greater than a predefined partition size comprises:

not flattening the hierarchy of the system graph.

3. The method of claim 1 wherein each of the i subtrees of the first subtree instance and j subtrees of the second subtree instance maintains the hierarchy of the system graph of the electronic circuit.

4. The method of claim 1 further comprising:

calculating a solution to each of the i subtrees while ignoring global links; and calculating a solution to each of the j subtrees while ignoring global links.

5. The method of claim 4 wherein calculating a solution to one of the i subtrees is performed on a different computing device than calculating a solution to one of the j subtrees.

6. The method of claim 4 wherein the calculating a solution to each of the i subtrees while ignoring global links comprises performing a matrix inversion.

7. The method of claim 4 wherein the calculating a solution to each of the i subtrees while ignoring global links comprises performing LU factoring.

8. The method of claim 1 wherein a local link forms a loop in one of the i subtrees of the first subtree instance.

9. The method of claim 1 wherein a tree branch forms no loops in the system graph.

10. The method of claim 1 wherein a link forms a loop in the system graph.

11. The method of claim 1 wherein each of the i subtrees is modeled by a block comprising:

a plurality of boundary nodes;

a plurality of boundary branches, one boundary branch coupled to each boundary node; and a center point node coupled to each of the boundary nodes through, at most, a single boundary branch.

12. A system comprising:

a network;

a plurality of computing devices, coupled to the network; and a circuit simulation block comprising:

a system tearing block to identify each branch of a given resistance-capacitance-inductance (RCL) circuit network graph as at least one of a tree branch or a link, wherein the tree branches form a tree of the graph, and the tree comprises no loops, divide the tree into at least a first subtree instance and a second subtree instance, wherein each the first and second subtree instances comprises no loops, and identify links of the given RCL circuit network graph as at least one of a global link or a local link, wherein a global link forms a path from a branch of the first subtree to a branch of the second subtree, a global link forms a loop with branches of the first and second subtrees, the first subtree is recursively partitioned to obtain i subtrees while a number of branches of each of the subtrees is greater than a predefined partition size, and the loop with the global link and branches of the first and second subtrees has a voltage drop of 0; and a subblock solver block to send an i subtree, without any global links, through the network to a first computing device of the plurality of computing devices for calculation and an i+1 subtree, without any global links, through the network to a second computing device of the plurality of computing devices for calculation.

13. The system of claim 12 wherein the second subtree is recursively partitioned to obtain j subtrees while a number of branches of each of the j subtrees is greater than the predefined partition size, and the subblock solver block is to send a j subtree, without any global links, through the network to a third computing device of the plurality of computing devices for calculation and a j+1 subtree, without any global links, through the network to a fourth computing device of the plurality of computing devices for calculation.

14. The system of claim 12 wherein each of the i subtrees is modeled by a block comprising:

a plurality of boundary nodes;

a plurality of boundary branches, one boundary branch coupled to each boundary node; and a center point node coupled to each of the of the boundary nodes through, at most, a single boundary branch.

15. A method comprising:

using at least one computer processor, recursively partitioning a system graph of an hierarchical electronic circuit design into a plurality of subcells while a number of branches in each of the subcell is greater than a predefined partition size, wherein subcells at a lowest level in a tree of the system graph are referred to as primitive cells;

converting each of the subcells into corresponding model blocks, each model block comprising:

a plurality of boundary nodes;

a plurality of boundary branches, one boundary branch coupled to each boundary node; and a center point node coupled to each of the of the boundary nodes through, at most, a single boundary branch;

determining initial value solutions for primitive cells using model blocks for the primitive cells;

assembling the primitive cells in a hierarchical fashion from a bottom to a top of the tree to obtain an assembled structure which maintain the hierarchy of the hierarchical electronic circuit design;

determining boundary conditions for the subcells;

using the determined initial value solutions for the primitive cells, calculating initial value solutions for each subcell from a bottom to a top of the assembled structure; and using the determined boundary conditions, calculating boundary value solutions for each subcell from a top to a bottom of the assembled structure.

16. The method of claim 15 wherein the calculating initial value solutions for each subcell from a bottom to a top of the assembled structure comprises:

calculating a solution to each subcell while ignoring global links, wherein a global link forms a path from a branch of a first subcell to a branch of a second subcell, and a loop with the global link and branches of the first and second subcells has a voltage drop of 0.

17. The method of claim 15 comprising:

building an input-output connectivity of the assembled structure.

18. The method of claim 15 wherein the assembling the primitive cells in a hierarchical fashion from a bottom to a top of the tree to obtain an assembled structure comprises:

providing a first model block, comprising first boundary nodes coupled via first boundary branches to a first center point node, corresponding to a first subcell;

providing a second model block, comprising second boundary nodes coupled via second boundary branches to a second center point node, corresponding to a second subcell;

determining a hierarchical connectivity between the first and second model blocks from the system graph tree comprises an intrablock branch, the intrablock branch comprising at least one of:

a first intrablock branch coupling the first center point node of the first model block to the second center point node of the second center point node;

a second intrablock branch coupling one of the first boundary branches of the first model block to one of the second boundary branches of the second model block; or a third intrablock branch coupling the second center point node of the second model block to one of the first boundary nodes of the first model block; and obtaining a third model block corresponding to the first and second model blocks and determined hierarchical connectivity, wherein the third model block comprises third boundary nodes coupled via third boundary branches to a third center point node, wherein the third center point node is coupled to each of the third boundary nodes through, at most, a single third boundary branch.

19. The method of claim 15 wherein the hierarchical electronic circuit design is specified using a hierarchical netlist.

20. The method of claim 15 comprising:

using the calculated initial value and boundary value solutions, determining node voltages for each node of the hierarchical electronic circuit design;

using the node voltages, determining branch voltages for branches in the system graph;

identifying independent loops in the graph;

summing the voltages for each independent loop in the graph;

summing the currents at each node in the graph;

summing power consumed for each branch in the graph to obtain a total power consumed;

determining a total input power to the circuit network using the input sources associated with the circuit;

subtracting the total power consumed from the total input power to obtain a total power difference;

indicating a not-validated condition when at least one of the loops in the graph has a nonzero sum;

indicating a not-validated condition when at least one of the nodes in the graph has a nonzero sum; and indicating a not-validated condition when the total power difference is not zero.

* * * * *